United States Patent
Lin et al.

(10) Patent No.: US 9,947,417 B2
(45) Date of Patent: Apr. 17, 2018

(54) MEMORY MANAGEMENT METHOD, MEMORY STORAGE DEVICE AND MEMORY CONTROLLING CIRCUIT UNIT

(71) Applicant: PHISON ELECTRONICS CORP., Miaoli (TW)

(72) Inventors: Wei Lin, Taipei (TW); Yu-Cheng Hsu, Yilan County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 453 days.

(21) Appl. No.: 14/636,191

(22) Filed: Mar. 3, 2015

(65) Prior Publication Data

US 2016/0188213 A1    Jun. 30, 2016

(30) Foreign Application Priority Data

Dec. 27, 2014    (TW) .................. 103145948

(51) Int. Cl.
| | |
|---|---|
| G06F 3/06 | (2006.01) |
| G11C 16/08 | (2006.01) |
| G11C 16/34 | (2006.01) |
| G11C 16/12 | (2006.01) |
| G11C 16/26 | (2006.01) |
| G11C 16/04 | (2006.01) |
| G11C 5/04 | (2006.01) |
| G11C 29/52 | (2006.01) |
| G11C 29/04 | (2006.01) |

(52) U.S. Cl.
CPC .......... *G11C 16/3459* (2013.01); *G11C 5/04* (2013.01); *G11C 16/0483* (2013.01); *G11C 16/08* (2013.01); *G11C 16/12* (2013.01); *G11C 16/26* (2013.01); *G11C 16/3404* (2013.01); *G11C 29/52* (2013.01); *G11C 2029/0411* (2013.01)

(58) Field of Classification Search
CPC ..... G11C 16/3459; G11C 16/12; G11C 16/08; G11C 16/0483; G11C 5/04; G11C 29/52; G11C 16/3404; G11C 2029/0411; G06C 16/26

See application file for complete search history.

(56) References Cited

U.S. PATENT DOCUMENTS

| | | | |
|---|---|---|---|
| 2011/0292724 A1* | 12/2011 | Kim ................... | G11C 16/0483 365/185.03 |
| 2013/0033933 A1* | 2/2013 | Park ................... | G11C 11/5642 365/185.03 |

(Continued)

*Primary Examiner* — Reginald Bragdon
*Assistant Examiner* — Mehdi Namazi
(74) *Attorney, Agent, or Firm* — JCIPRNET

(57) ABSTRACT

A memory management method, a memory storage device and a memory controlling circuit unit are provided. The method includes: programming data into a plurality of memory cells of a rewritable non-volatile memory module; determining whether a storage state of the data conforms with a first condition or a second condition based on a default bias range and a threshold voltage distribution of the memory cells storing the data; performing a first operation if the storage state of the data conforms with the first condition; and performing a second operation if the storage state of the data conforms with the second condition. Accordingly, the probability of misidentifying the valid data as the invalid data may be reduced.

23 Claims, 11 Drawing Sheets

(56) References Cited

U.S. PATENT DOCUMENTS

| | | | | |
|---|---|---|---|---|
| 2013/0297986 A1* | 11/2013 | Cohen | ............ | G11C 29/52 714/763 |
| 2014/0101372 A1* | 4/2014 | Jung | ............ | G06F 12/0253 711/103 |
| 2015/0095741 A1* | 4/2015 | Lin | ............ | G06F 11/1048 714/773 |

* cited by examiner

MEMORY MANAGEMENT METHOD, MEMORY STORAGE DEVICE AND MEMORY CONTROLLING CIRCUIT UNIT

CROSS-REFERENCE TO RELATED APPLICATION

This application claims the priority benefit of Taiwan application serial no. 103145948, filed on Dec. 27, 2014. The entirety of the above-mentioned patent application is hereby incorporated by reference herein and made a part of this application.

BACKGROUND

1. Technical Field

The disclosure relates to a memory management method, and particularly relates to a memory management method, a memory storage device, and a memory controlling circuit unit.

2. Description of Related Art

The markets of digital cameras, cellular phones, and MP3 players have expanded rapidly in recent years, resulting in escalated demand for storage media by consumers. Since the rewritable non-volatile memory module (e.g., flash memory) has the advantages of non-volatility, low power consumption, having a compact size, and having no mechanical structure, the rewritable non-volatile memory is suitable to be built in the aforesaid portable multimedia devices.

Generally speaking, data written before a memory device is powered off may contain many errors. Thus, after the memory storage device is turned on again, some data written before the memory device being powered off may be found out and identified as invalid data. However, how to reduce the probability that valid data in the memory storage device are misjudged as invalid data is still an issue to be worked on.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

The disclosure provides a memory management method, a memory storage device, and a memory controlling circuit unit capable of reducing the probability of misjudging valid data as invalid data.

An exemplary embodiment of the disclosure provides a memory management method for a rewritable non-volatile memory module including a plurality of memory cells, the method including: programming data to the memory cells; determining whether a storage state of the data conforms with a first condition or a second condition based on a default bias range and a threshold voltage distribution of the memory cells storing the data; performing a first operation if the storage state of the data conforms with the first condition; and performing a second operation if the storage state of the data conforms with the second condition, wherein the first operation is different from the second operation.

Another exemplary embodiment of the disclosure provides a memory storage device, including a connecting interface unit, a rewritable non-volatile memory module, and a memory controlling circuit unit. The connecting interface unit is coupled to a host system. The rewritable non-volatile memory module includes a plurality of memory cells. The memory controlling circuit unit is coupled to the connecting interface unit and the rewritable non-volatile memory module. The memory controlling circuit unit is configured to write data to the memory cells. The memory controlling circuit unit is further configured to determine whether a storage state of the data conforms with a first condition or a second condition based on a default bias range and a threshold voltage distribution of the memory cells storing the data. A first operation is performed if the storage state of the data conforms with the first condition. A second operation is performed if the storage state of the data conforms with the second condition. In addition, the first operation is different from the second condition.

Another exemplary embodiment of the disclosure provides a memory controlling circuit unit for controlling a rewritable non-volatile memory module including a plurality of memory cells. The memory controlling circuit unit includes a host interface, a memory interface, and a memory management circuit. The host interface is configured to be coupled to a host system. The memory interface is coupled to the rewritable non-volatile memory module. The memory management circuit is coupled to the host interface and the memory interface. The memory management circuit is configured to send a writing command sequence and the writing command sequence instruct to write data to the memory cells. The memory management circuit is further configured to determine whether a storage state of the data conforms with a first condition or a second condition based on a default bias range and a threshold voltage distribution of the memory cells storing the data. A first operation is performed if the storage state of the data conforms with the first condition. A second operation is performed if the storage state of the data conforms with the second condition. In addition, the first operation is different from the second condition.

Based on the above, differing from the conventional way where whether data is valid is determined simply based on the number of error bits in the data, the disclosure uses the bias region to find out the invalid data written before the system is powered off, thereby reducing the probability that valid data is misjudged as invalid data.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

To make the above features and advantages of the disclosure more comprehensible, embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
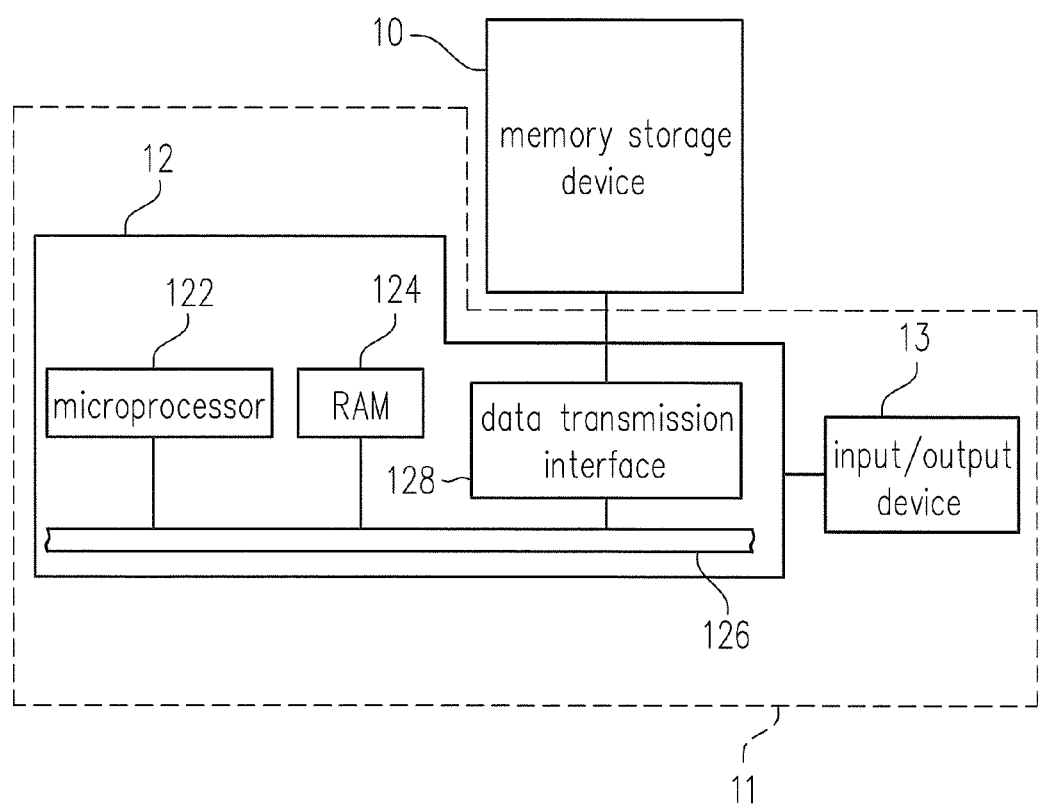
FIG. 1 is a schematic view illustrating a host system and a memory storage device according to an exemplary embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may include any one or more of the novel features described herein, including in the Detailed Description, and/or shown in the drawings. As used herein, "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally speaking, a memory storage device (i.e., a memory storage system) includes a rewritable non-volatile memory module and a controller (i.e., a controlling circuit). The memory storage device is usually used together with a host system, such that the host system can write data into or read data from the memory storage device.

Figure 2:
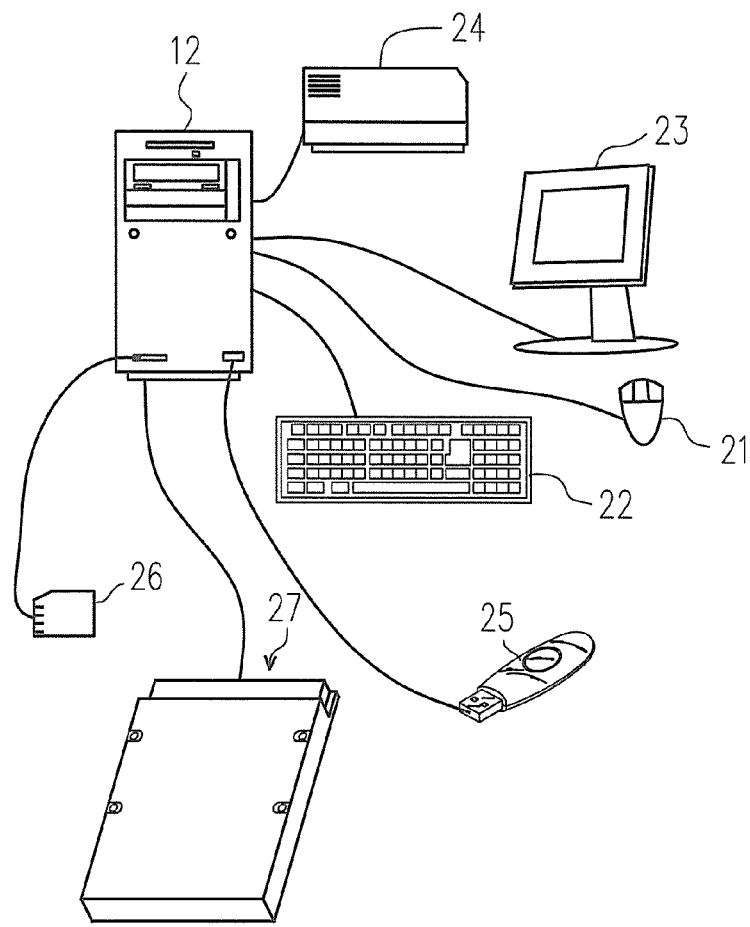
FIG. 2 is an exemplary schematic view illustrating a computer, an input/output device, and a memory storage device according to an exemplary embodiment of the disclosure.

FIG. 1 is an exemplary schematic view illustrating a host system and a memory storage device according to an exemplary embodiment of the disclosure. FIG. 2 is an exemplary schematic view illustrating a computer, an input/output device, and a memory storage device according to an exemplary embodiment of the disclosure.

Referring to FIG. 1, a host system 11 generally includes a computer 12 and an input/output (I/O) device 13. The computer 12 includes a microprocessor 122, a random access memory (RAM) 124, a system bus 126, and a data transmission interface 128. The input/output device 13 includes a mouse 21, a keyboard 22, a display 23 and a printer 24 as shown in FIG. 2. It should be understood that the devices illustrated in FIG. 2 do not serve to limit the input/output device 13. The input/output device 13 may further include other devices.

In an exemplary embodiment, the memory storage device 10 is coupled to other elements of the host system 11 through the data transmission interface 128. Through operations of the microprocessor 122, the random access memory 124 and the input/output device 13, data may be written into or read from the memory storage device 10. For instance, the memory storage device 10 may be a rewritable non-volatile memory storage device, such as a flash drive 25, a memory card 26, or a solid state drive (SSD) 27, etc., as shown in FIG. 2.

Figure 3:
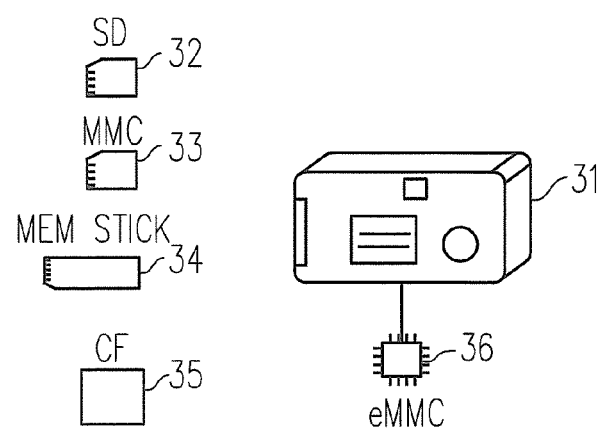
FIG. 3 is an exemplary schematic view illustrating a host system and a memory storage device according to an exemplary embodiment of the disclosure.

FIG. 3 is an exemplary schematic view illustrating a host system and a memory storage device according to an exemplary embodiment of the disclosure.

Generally speaking, the host system 11 may be any system substantially collocated with the memory storage device 10 for storing data. Even though the host system 11 is described as a computer system in this exemplary embodiment, in another exemplary embodiment, the host system 11 may be a digital camera, a video camera, a communication device, an audio player, or a video player, etc. For example, if the host system is a digital camera (video camera) 31, the rewritable non-volatile memory storage device is then a secure digital (SD) card 32, a multimedia card (MMC) 33, a memory stick 34, a compact flash (CF) card 35 or an embedded storage apparatus 36 (as shown in FIG. 3). The embedded storage device 36 includes an embedded MMC (eMMC). It should be mentioned that the eMMC is directly coupled to a substrate of the host system.

Figure 4:
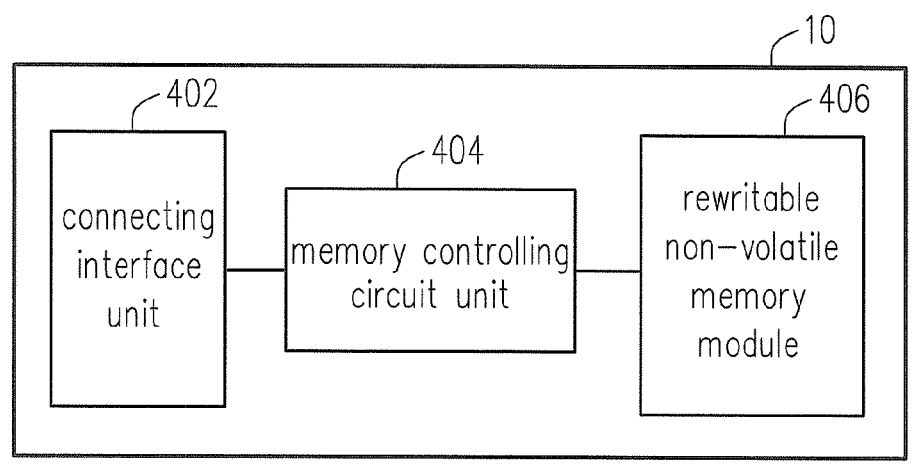
FIG. 4 is a schematic block view of the memory storage device shown in FIG. 1.

FIG. 4 is a schematic block view of the memory storage device shown in FIG. 1.

Referring to FIG. 4, the memory storage device 10 includes a connecting interface unit 402, a memory controlling circuit unit 404, and a rewritable non-volatile memory module 406.

In this exemplary embodiment, the connecting interface unit 402 is compatible with the standard of serial advanced technology attachment (SATA). However, it should be understood that the disclosure is not limited thereto. The connecting interface unit 402 may also be compatible with the parallel advanced technology attachment (PATA) standard, the Institute of Electrical and Electronic Engineers (IEEE) 1394 standard, the peripheral component interconnect express (PCI Express) standard, the universal serial bus (USB) standard, the secure digital (SD) interface standard, the ultra high speed-I (UHS-I) interface standard, the ultra high speed-II (UHS-II) interface standard, the memory stick (MS) interface standard, the multimedia card (MMC) interface standard, the embedded multimedia card (eMMC) interface standard, the universal flash storage (UFS) interface standard, the compact flash (CF) interface standard, the integrated device electronics (IDE) standard, or other suitable standards. The connecting interface unit 402 may be packaged with the memory controlling circuit unit 404 in one chip, or the connecting interface unit 402 may be configured independently from a chip including the memory controlling circuit unit 404.

The memory controlling circuit unit 404 is configured for executing a plurality of logic gates or control commands implemented in a hardware form or in a firmware form, and performing various operations, such as data writing, data reading or data erasing in the rewritable non-volatile memory module 406 according to commands of the host system 11.

The rewritable non-volatile memory module 406 is coupled to the memory controlling circuit unit 404 and is configured to store the data written by the host system 11. The rewritable non-volatile memory module 406 may be a single level cell (SLC) NAND flash memory module (i.e., a flash memory module where each memory cell stores one bit of data), a multi-level cell (MLC) NAND flash memory module (i.e., a flash memory module where each memory cell stores two bits of data), a triple level cell (TLC) NAND flash memory module (i.e., a flash memory module where each memory cell stores three bits of data), other flash memory modules or other memory modules having the same characteristics.

Figure 5:
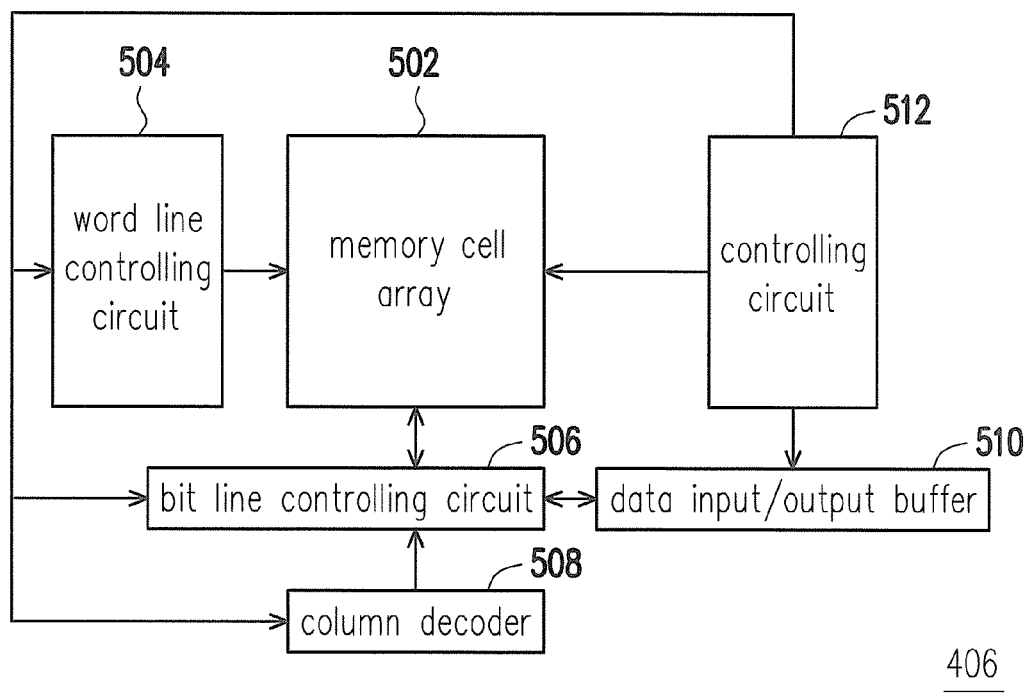
FIG. 5 is a schematic block view illustrating a rewritable non-volatile memory module according to an exemplary embodiment of the disclosure.
Figure 6:
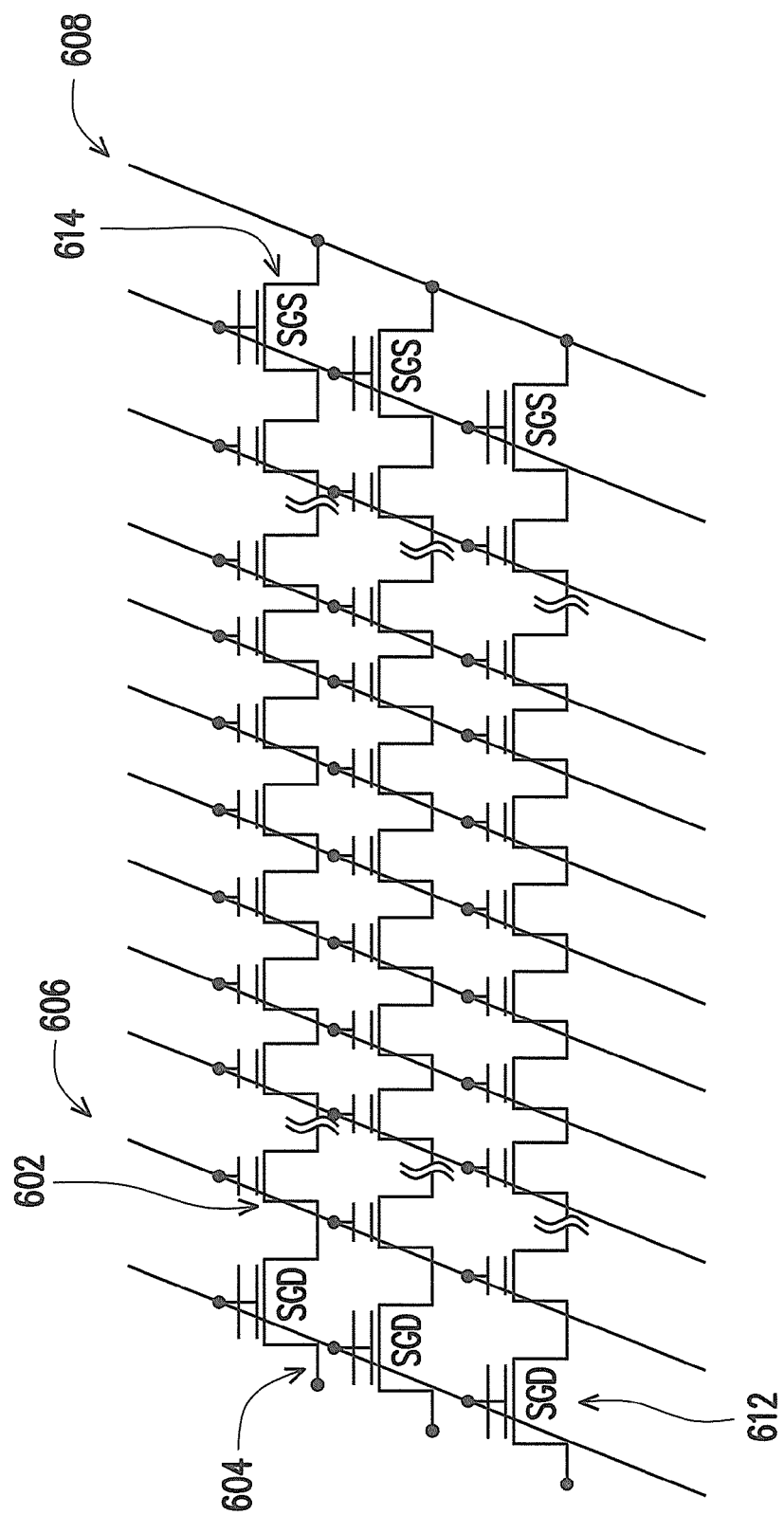
FIG. 6 is an exemplary schematic view illustrating a memory cell array according to an exemplary embodiment of the disclosure.

FIG. 5 is a schematic block view illustrating a rewritable non-volatile memory module according to an exemplary embodiment of the disclosure. FIG. 6 is an exemplary schematic view illustrating a memory cell array according to an exemplary embodiment of the disclosure.

Referring to FIG. 5, the rewritable non-volatile memory module 406 includes a memory cell array 502, a word line controlling circuit 504, a bit line controlling circuit 506, a column decoder 508, a data input/output buffer 510, and a controlling circuit 512.

In this exemplary embodiment, the memory cell array 502 may include a plurality of memory cells 602 for storing data, a plurality of select gate drain (SGD) transistors 612, and a plurality of select gate source (SGS) transistors 614, and a plurality of bit lines 604, a plurality of word lines 606, and a common source line 608 connecting the memory cells, as shown in FIG. 6. The memory cells 602 are disposed at intersecting points of the bit lines 604 and the word lines 606 by array management (or by 3D stacking). When the memory controlling circuit unit 404 receives a write command or a read command, the controlling circuit 512 may control the word line controlling circuit 504, the bit line controlling circuit 506, the column decoder 508, and the data input/output buffer 510 to write data to or read data from the memory cell array 502. In addition, the word line controlling circuit 504 controls a voltage applied to the word lines 606, the bit line controlling circuit 506 controls a voltage applied to the bit lines 604, the column decoder 508 chooses a corresponding bit line according to a row address in the command, and the data input/output buffer 510 temporarily stores data.

In the rewritable non-volatile memory module 406, each memory cell stores one or more bits by changing a threshold voltage. Specifically, in each memory cell, a charge trapping layer is provided between a control gate and a channel. By applying a writing voltage to the control gate, an electron quantity of the charge trapping layer may be changed, thereby changing the threshold voltage of the memory cell. The process of changing the threshold voltage is also called "writing data to the memory cell," "programming data into the memory cell" or "programming the memory cell." As the threshold voltage changes, each memory cell of the memory cell array 502 may have a plurality of storage states. Also, based on a reading voltage, the storage state of the memory cell may be determined, and the one or more bits stored in the memory cell are thus accessed.

Figure 7:
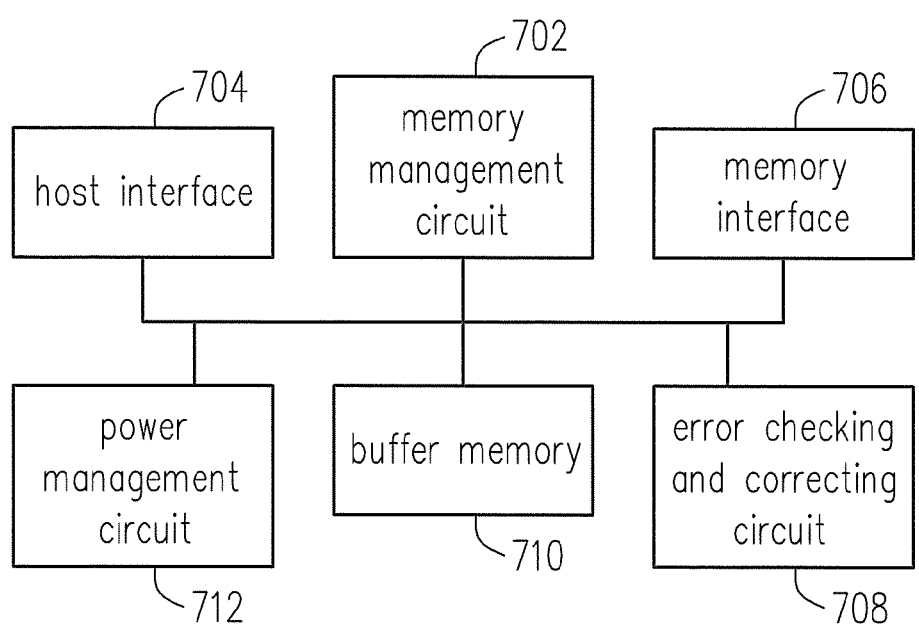
FIG. 7 is a schematic block view illustrating a memory controlling circuit unit according to an exemplary embodiment of the disclosure.

FIG. 7 is a schematic block view illustrating a memory controlling circuit unit according to an exemplary embodiment of the disclosure.

Referring to FIG. 7, the memory controlling circuit unit 404 includes a memory management circuit 702, a host interface 704, a memory interface 706, and an error detecting and correcting circuit 708.

The memory management circuit 702 controls an overall operation of the memory controlling circuit unit 404. Specifically, the memory management circuit 702 has a plurality of control commands. When the memory storage device 10 is operated, the control commands are executed to perform various data operations such as data writing, data reading and data erasing. In the following, the description about the operations of the memory management circuit 702 is equivalent to that of the memory controlling circuit unit 404. Thus, the repeated contents will not be reiterated again.

In this exemplary embodiment, the control commands of the memory management circuit 702 are implemented in a firmware form. For instance, the memory management circuit 702 has a microprocessor (not shown) and a read-only memory (not shown), and the control commands are burnt into the read-only memory. When the memory storage apparatus 10 is operated, the control commands are executed by the microprocessor for various data operations, such as data writing, data reading or data erasing.

In another exemplary embodiment, the control commands of the memory management circuit 702 may also be stored in the form of program codes in a specific area (for example, a system area in the memory module exclusively used for storing system data) of the rewritable non-volatile memory module 406. Moreover, the memory management circuit 702 has a microprocessor unit (not shown), a read-only memory (not shown), and a random access memory (not shown). Specifically, the read-only memory has a boot code. When the memory controller 404 is enabled, the boot code is first executed by the microprocessor unit for loading the control commands stored in the rewritable non-volatile memory module 406 into the random access memory of the memory management circuit 702. Afterwards, the microprocessor unit executes the control commands for various data operation such as data writing, data reading and data erasing.

Additionally, in another exemplary embodiment, the control commands of the memory management circuit 702 may also be implemented in a hardware form. For example, the memory management circuit 702 includes a microcontroller, a memory writing unit, a memory reading unit, a memory erasing unit and a data processing unit. The memory management unit, the memory writing unit, the memory reading unit, the memory erasing unit and the data processing unit are coupled to the microcontroller. The memory management unit is configured for managing physical erasing units of the rewritable non-volatile memory module 406. The memory writing unit is configured for providing a write command to the rewritable non-volatile memory module 406 to write data into the rewritable non-volatile memory module 406. The memory reading unit is configured for providing a read command to the rewritable non-volatile memory module 406 to read data from the rewritable non-volatile memory module 406. The memory erasing unit is configured for providing an erase command to the rewritable non-volatile memory module 406 to erase data from the rewritable non-volatile memory module 406. The data processing unit is configured for processing the data to be written into the rewritable non-volatile memory module 406 and the data to be read from the rewritable non-volatile memory module 406.

The host interface 704 is coupled to the memory management circuit 702 and configured for receiving and identifying commands and data sent from the host system 11. Namely, the commands and data sent from the host system 11 are sent to the memory management circuit 702 through the host interface 704. In this exemplary embodiment, the host interface 704 is compatible with the SATA standard. However, it should be understood that the disclosure is not limited thereto. The host interface 704 may also be compatible with the PATA standard, the IEEE 1394 standard, the PCI Express standard, the USB standard, the SD standard, the UHS-I standard, the UHS-II standard, the CF standard, the IDE standard or other suitable data transmission standards.

The memory interface 706 is coupled to the memory management circuit 702 for accessing the rewritable non-volatile memory module 406. In other words, data to be written into the rewritable non-volatile memory module 406 are converted by the memory interface 706 into a format acceptable to the rewritable non-volatile memory module 406. Specifically, if the memory management circuit 702 intends to access the rewritable non-volatile memory module 406, the memory interface 706 may send a corresponding command sequence. The command sequence may include one or more signals or data on a bus. For example, a reading command sequence include information such as a reading identification code, a memory address, etc.

The error detecting and correcting circuit 708 is coupled to the memory management circuit 702 and configured for performing an error detecting and correcting process to ensure the accuracy of data. Specifically, when the memory management circuit 702 receives a write command from the host system 11, the error detecting and correcting circuit 708 may generate a corresponding error correcting code (ECC) and/or error detecting code (EDC) for data corresponding to the write command. In addition, the memory management circuit 702 may write the data corresponding to the write command and the corresponding error correcting code and/or error detecting code into the rewritable non-volatile memory module 406. Then, when the memory management circuit 702 reads the data from the rewritable non-volatile memory module 406, the memory management circuit 702 also reads the error correcting code and/or error detecting code corresponding to the data, and the error detecting and correcting circuit 708 may perform the error detecting and correcting process to the read data according to the error correcting code and/or the error detecting code.

In an exemplary embodiment, the memory controlling circuit unit 404 further includes a buffer memory 710 and a power management circuit 712. The buffer memory 710 is coupled to the memory management circuit 702 and configured for temporarily storing data and commands from the host system 11 or data from the rewritable non-volatile memory module 406. The power management circuit 712 is coupled to the memory management circuit 702 and configured for controlling power of the memory storage device 10.

Figure 8:
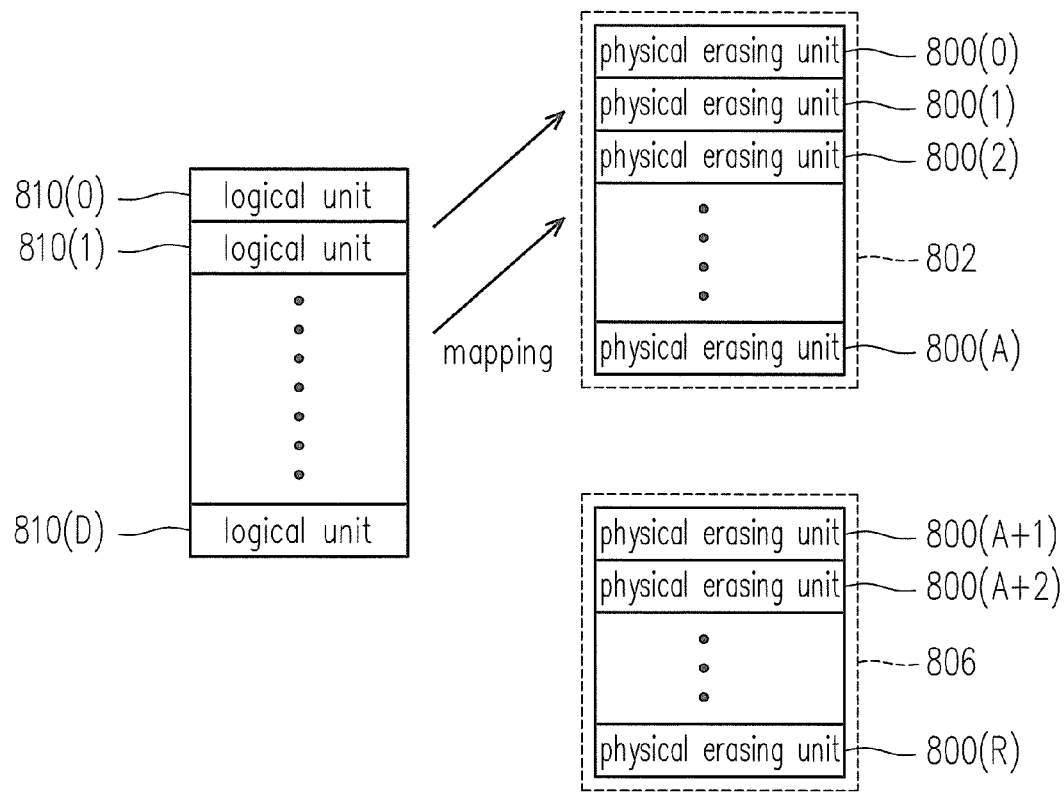
FIG. 8 is an exemplary schematic view illustrating managing a rewritable non-volatile memory module according to an exemplary embodiment of the disclosure.

FIG. 8 is an exemplary schematic view illustrating managing a rewritable non-volatile memory module according to an exemplary embodiment of the disclosure. It should be understood that when describing operations of the physical erasing units of the rewritable non-volatile memory module 406, operations of the physical erasing units described with terms such as "select," "group," "divide," and "associate" refer to logical concepts. In other words, actual positions of the physical erasing units of the rewritable non-volatile memory module are not changed. Instead, operations are performed logically to the physical erasing units of the rewritable non-volatile memory module.

The memory cells of the rewritable non-volatile memory module 406 form a plurality of physical programming units, and the physical programming units form the physical erasing units. Specifically, memory cells on the same word line form one or more physical programming units. If each memory cell stores two or more bits, the physical programming units on the same word line may be at least grouped into a lower physical programming unit and an upper physical programming unit. For example, the least significant bit (LSB) of a memory cell belongs to the lower physical programming unit, while the most significant bit (MSB) of a memory cell belongs to the upper physical programming unit. Generally speaking, in the MLC NAND flash memory, a write speed of the lower physical programming unit is faster than a write speed of the upper physical programming unit, or a reliability of the lower physical programming unit is higher than a reliability of the higher physical programming unit. In this exemplary embodiment, the physical programming unit is the minimal unit for programming. In other words, the physical programming unit is a minimal unit for writing data. For example, the physical programming unit is a physical page or a physical sector. If the physical programming unit is a physical page, then the physical programming unit usually includes a data bit area and a redundant bit area. The data bit area includes a plurality of physical sectors for storing the user data, and the redundant bit area stores the system data (e.g., error correcting codes). In this exemplary embodiment, the data bit area includes 32 physical sectors, and each physical sector is in a size of 512 bytes (B). However, in other exemplary embodiments, the data bit area may also include 8, 16, or more or less physical sectors. The disclosure is not limited by the size and number of the physical sectors. Besides, the physical erasing unit is a minimal unit for erasing. In other words, each physical erasing unit includes a minimal number of memory cells that are erased together. For example, the physical erasing unit is a physical block.

Referring to FIG. 8, the memory management circuit 702 may logically group physical erasing units 800(0) to 800(R) of the rewritable non-volatile memory module 406 into a plurality of areas, such as a storage area 802 and a system area 806.

The physical erasing units in the storage area 802 are configured to store data from the host system 11. The storage area 802 stores valid data and invalid data. For example, if the host system 11 deletes a valid data, the deleted data may still be stored in the storage area 802 but marked as invalid data. A physical erasing unit that does not store valid data is also termed as a spare physical erasing unit. For example, a physical erasing unit after erasing becomes a spare physical erasing unit. If a physical erasing unit in the storage area 802 or the system area 806 is damaged, another physical erasing unit in the storage area 802 may replace the damaged physical erasing unit. If there is no physical erasing unit in the storage area 802 available to replace the damaged physical erasing unit, the memory management circuit 702 may declare that the whole memory storage device 10 is in a write protect state and is not available for data writing any more. In addition, a physical erasing unit that stores valid data is also termed as a non-spare physical erasing unit.

The physical erasing units in the system area 806 are configured to record system data. The system data include the manufacturer and model number of a memory chip, the number of physical erasing units of the memory chip, and the number of physical programming units in each physical erasing unit, etc.

The numbers of the physical erasing units in the storage area 802 and the system area 806 may differ as the specifications of memories differ. However, it should be understood that in the operation of the memory storage device 10, a grouping of the physical erasing units associated to the storage area 802 and the system area 806 changes dynamically. For example, when a physical erasing unit in the system area 806 is damaged and replaced by a physical erasing unit in the storage area 802, the physical erasing unit originally belonging to the storage area 802 is associated to the system area 806.

The memory management circuit 702 configures the logical units 810(0) to 810(D) to map the physical erasing units 800(0) to 800(A) in the storage area 802. For example, in this exemplary embodiment, the host system 11 accesses the data in the storage area 802 through logical addresses. Thus, each of the logical units 810(0) to 810(D) refers to a logical address. Besides, in an exemplary embodiment, each of the logical units 810(0) to 810(D) may also refer to a logical sector, a logical programming unit, a logical erasing unit, or be formed of a plurality of logical addresses. Each of the logical units 810(0) to 810(D) is mapped to one or more physical units. In this exemplary embodiment, one physical unit refers to one physical erasing unit. However, in another exemplary embodiment, one physical unit may also refer to one physical address, one physical sector, one physical programming unit, or be formed of a plurality of physical addresses. The disclosure is not limited thereto. The memory management circuit 702 may record mapping relations between the logical units and the physical units in one or more logical-physical mapping tables. When the host system 11 intends to read data from or write data to the memory storage device 10, the memory management circuit 702 may access the data of the memory storage device 10 according to the one or more logical-physical mapping tables.

Figure 9:
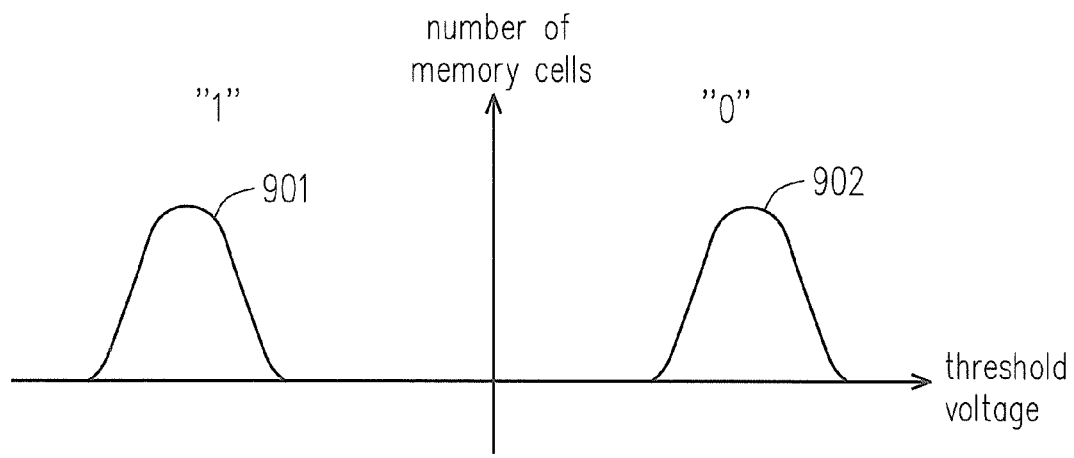
FIG. 9 is a diagram illustrating threshold voltage distributions according to an exemplary embodiment of the disclosure.

FIG. 9 is a diagram illustrating threshold voltage distributions according to an exemplary embodiment of the disclosure.

Referring to FIG. 9, the horizontal axis represents the threshold voltage of the memory cell, and the vertical axis represents the number of memory cells. The memory management circuit 702 may send a writing command sequence to the rewritable non-volatile memory module 406. The writing command sequence includes one or more command or program codes and is configured to instruct to write data to a physical programming unit in the rewritable non-volatile memory module 406. FIG. 9 illustrates the threshold voltage of each of the memory cells in this physical programming unit. Here, it is assumed that a memory cell stores a bit "1" if the threshold voltage of the memory cell falls within a distribution 901, and a memory cell stores a bit "0" if the threshold voltage of the memory cell falls within a distribution 902. It should be noted that the exemplary embodiment is exemplified with a SLC NAND flash memory module, so there are two possibilities for the threshold voltage distributions. However, in other exemplary embodiments, there may be four, eight or an arbitrary number of possibilities for threshold voltage distributions, and the read voltage may be applied between any two of the distributions. In addition, the disclosure does not intend to limit the data represented by each distribution. For example, in another exemplary embodiment, the distribution 901 may represent the bit "0," while the distribution 902 may represent the bit "1."

When it is intended to read data from the rewritable non-volatile memory module 406, the memory management circuit 702 may send a reading command sequence to the rewritable non-volatile memory module 406. The reading command sequence includes one or more commands or program codes and is configured to instruct to read a plurality of memory cells in a physical programming unit, so as to obtain a plurality of bits. For example, the memory management circuit 702 may read a plurality of memory cells of a physical programming unit according to a read voltage between the distributions 901 and 902. If a threshold voltage of a memory cell is lower than the read voltage, the memory cell is turned on and the memory management circuit 702 reads the bit "1." On the contrary, if a threshold voltage of a memory cell is higher than the read voltage, the memory cell is not turned on and the memory management circuit 702 reads the bit "0."

Figure 10:
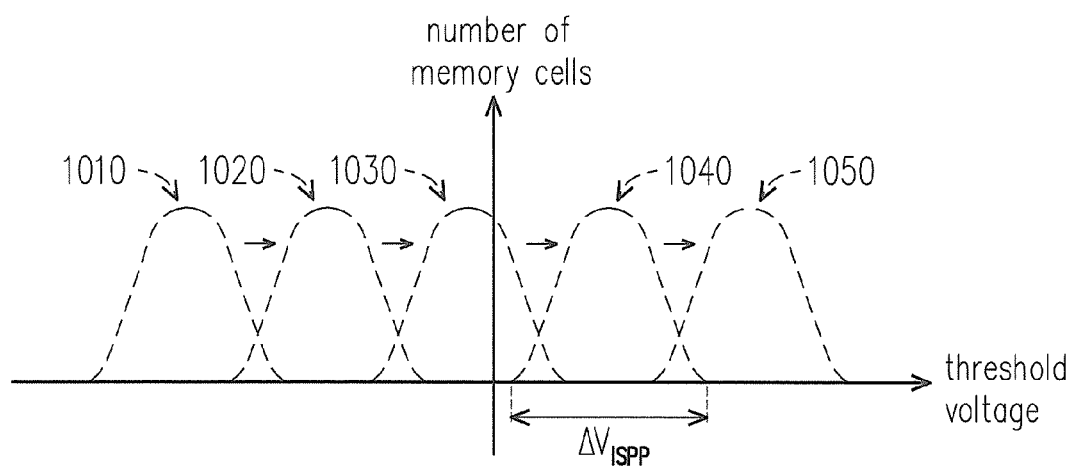
FIG. 10 is a schematic view illustrating programming memory cells according to an exemplary embodiment of the disclosure.

FIG. 10 is a schematic view illustrating programming memory cells according to an exemplary embodiment of the disclosure.

Referring to FIG. 9 and FIG. 10, in this exemplary embodiment, the memory management circuit 702 instructs to program the memory cells based on a programming model of incremental-step-pulse programming (ISPP). In the ISPP programming model, a write voltage (also called write bias) for programming is gradually increased until the memory cells is programmed to a correct storage state. For example, for memory cells need to be programmed to the distribution 901, the memory management circuit 702 may use an initial write bias to program the memory cells. Then, the memory management circuit 702 may gradually increase the write bias to perform programming for a plurality of times (e.g., adding a bias adjustment amount to the write bias and performing the next programming). For example, based on the gradually increasing write bias, the threshold voltage distribution of the memory cells that are programmed may move from an original position 1010 to a position 1050 in sequence. Here, it is assumed that the threshold voltage distribution on the position 1050 indicates the correct storage state of the memory cells. Thus, when the threshold voltage distribution of the memory cells that are programmed is located at the position 1050, the distribution 901 corresponding to the correct storage state is obtained. It should be noted that it is assumed herein that the initial write bias is 16 voltages (V), the bias adjustment amount is set at 0.6V, and a distribution range (also called distribution region) of voltage of each distribution in the ISPP programming model is $\Delta V_{ISPP}$ (as shown in FIG. 10). However, the number of times that the threshold voltage distribution is changed between the positions 1010 to 1050 may increase or decrease according to the bias adjustment amount increased each time, and the disclosure is not limited thereto. Also, the initial write bias and/or the bias adjustment amount used in programming may be determined according to the instruction of the memory management circuit 702 or determined by the rewritable non-volatile memory module 406 itself (e.g., controlled by the controlling circuit 512). The disclosure is not limited thereto.

During the use of the memory storage device 10, the memory storage device 10 may be powered off or turned off at any time. If some memory cells in the rewritable non-volatile memory module 406 are not yet programmed to the correct storage state when the memory storage device 10 is powered off or turned off, the data stored in the memory cells may contain many errors.

Figure 11:
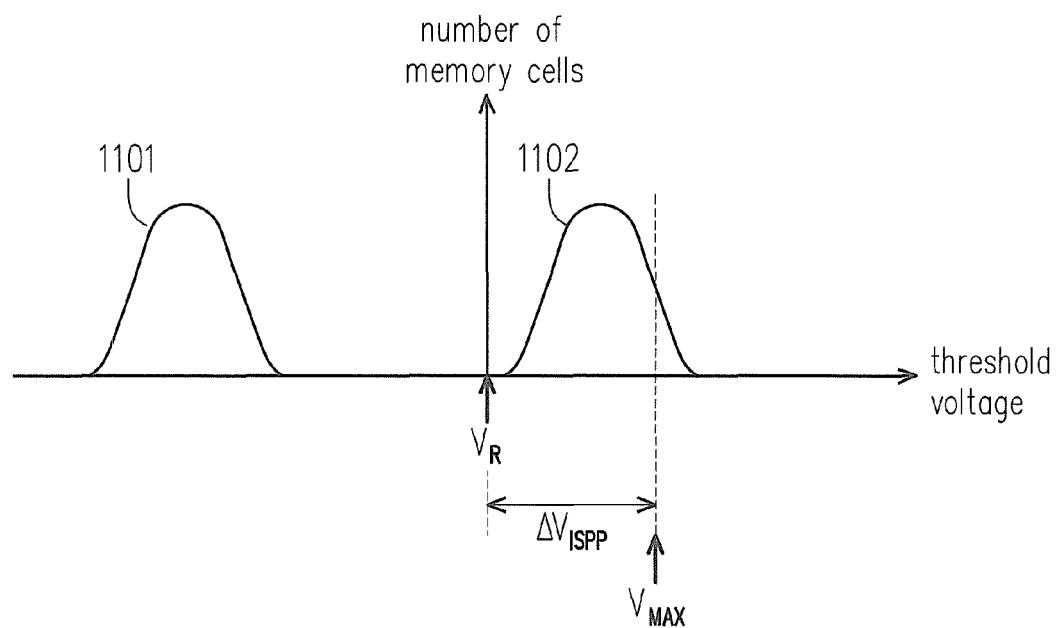
FIG. 11 is a schematic view illustrating an error threshold voltage distribution according to an exemplary embodiment of the disclosure.

FIG. 11 is a schematic view illustrating an error threshold voltage distribution according to an exemplary embodiment of the disclosure.

Referring to FIG. 10 and FIG. 11, during a process of programming memory cells of a physical programming unit, assuming that the threshold voltage distribution of the memory cells is at a position 1040 and the memory storage device 10 is suddenly powered off, then the threshold voltage distributions of all the memory cells in the physical programming unit may be distributions 1101 and 1102, for example. The distribution 1102 is located at the error position 1040 (i.e., the correct position is the position 1050), and the memory cells in the distribution 1102 contain many errors. In addition, the distribution ranges of voltage of the distributions 1101 and 1102 are compliant with the ISPP programming model. In other words, the distribution range of voltage of each of the distributions 1101 and 1102 is $\Delta V_{ISPP}$.

Conventionally, to find out data that are not correctly stored owing to the device being powered off or turned off, the memory storage device may, after the memory storage device is supplied with power (or is turned on), determine whether data in a specific area in the rewritable non-volatile memory module contains too many errors. If the data contains too many error bits, the data may be directly regarded as data that are not correctly stored before the device is powered off or turned off and are thus marked as invalid data. However, with the above mechanism, some data not written before the device is powered off or turned off may be labeled as invalid data without being suitably corrected simply because it contains too many error bits. The disclosure is able to accurately identify which data should be regarded as invalid data not being correctly stored before the device is powered off or turned off, and which data simply contains too many error bits and requires suitable correction, thereby reducing the probability of misjudgment.

In this exemplary embodiment, after data is written to the memory cells, the memory management circuit 702 may determine whether a storage state of the data conforms with a first condition or a second condition according to a default bias range and a threshold voltage distribution of the memory cells storing the data. If the storage state of the data conforms with the first condition, it is indicated that the data is effectively programmed to the corresponding memory cells. If the storage state of the data conforms with the second condition, it is indicated that the data is not effectively programmed to the corresponding memory cells. For example, in an exemplary embodiment, the memory management circuit 702 may scan the memory cells to obtain the threshold voltage distribution of the memory cells. The memory management circuit 702 may determine whether the distribution range of the threshold voltage distribution is consistent with the default bias range. If the distribution range of the threshold voltage distribution is inconsistent with the default bias range, the memory management circuit 702 may determine that the storage state of the data conforms with the first condition and perform a first operation accordingly. For example, the first operation may include identifying the memory cells as storing valid data, and the data in the memory cells may be read and further decoded/corrected. On the contrary, if the distribution range of the threshold voltage distribution is consistent with the default bias range, the memory management circuit 702 may determine that the storage state of the data conforms with the second condition and perform a second operation. The first operation and the second operation are different. Here, by describing that the first operation and the second operation are different, it is meant that the first operation and the second operation differ in all or some of details of the operations. For example, the second operation may include identifying the memory cells as storing invalid data, and it is neither necessary to read the data in the memory cells nor to further decode/correct the data. In addition, the second operation may also include notifying the host system 11 that the data has a write error and requesting re-writing.

Figure 12:
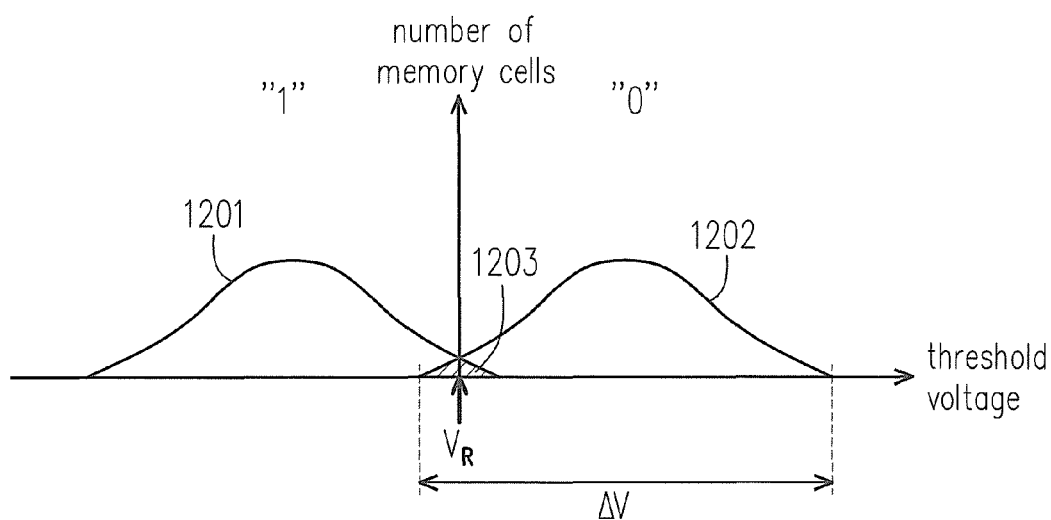
FIG. 12 is a schematic view illustrating determining whether data is effectively programmed to the memory cells according to an exemplary embodiment of the disclosure.

FIG. 12 is a schematic view illustrating determining whether data is effectively programmed to the memory cells according to an exemplary embodiment of the disclosure.

Referring to FIG. 12, assuming that some data is stored in some memory cells for a longer time, the data is accessed more often, and/or the memory cells undergo a high-temperature process, then the threshold voltage distribution of the memory cells may be similar to distributions 1201 and 1202. Here, the distribution 1201 represents memory cells storing the bit "1," and the distribution 1202 represents memory cells storing the bit "0." In addition, there is an overlapped area 1203 (shown with oblique lines) between the distributions 1201 and 1202. In the overlapped area 1203, some memory cells storing the bit "0" may be identified as storing the bit "1," and some memory cells storing the bit "1" may be identified as storing the bit "0." For example, assuming that a default read voltage $V_R$ is used to read the memory cells, memory cells actually storing the bit "0" but having the threshold voltage lower than the read voltage $V_R$ may be erroneously identified as storing the bit "1," and memory cells actually storing the bit "1" but having the threshold voltage higher than the read voltage $V_R$ may be erroneously identified as storing the bit "0." Besides, in another exemplary embodiment, the distribution 1202 may also represent the memory cells storing the bit "1," and the distribution 1201 may also represent the memory cells storing the bit "0." The disclosure is not limited thereto.

The memory management circuit 702 may set the distribution range $\Delta V_{ISPP}$ as the default bias range. The memory management circuit 702 may scan the memory cells to obtain the threshold voltage distribution (e.g., the distribution 1202) of the memory cells. The memory management circuit 702 may obtain a distribution range $\Delta V$ (as shown in FIG. 12) of voltage of the distribution 1202. The memory management circuit 702 may determine whether the distribution range $\Delta V$ is consistent with the distribution range $\Delta V_{ISPP}$. For example, the memory management circuit 702 may determine whether the distribution range $\Delta V$ is smaller than or equal to the distribution range $\Delta_{ISPP}$. In the exemplary embodiment shown in FIG. 12, the distribution range $\Delta V$ is greater than the distribution range $\Delta V_{ISPP}$, indicating that the distribution range $\Delta V$ and the distribution range $\Delta V_{ISPP}$ are inconsistent. Therefore, the memory management circuit 702 may determine that the data in the memory cells is effectively programmed to the memory cells and perform the first operation. In other words, even though the data stored in the memory cells contain many error bits, the memory management circuit 702 does not misjudge the data stored in the memory cells as invalid data that is stored before the memory storage device 10 is powered off or turned off. However, in another exemplary embodiment, if the distribution range $\Delta V$ is smaller than or equal to the distribution range $\Delta V_{ISPP}$ (e.g., the exemplary embodiment shown in FIG. 11), it is indicated that the distribution range $\Delta V$ is consistent with the distribution range $\Delta V_{ISPP}$. Thus, the memory management circuit 702 may determine that the data in the memory cells is not effectively programmed to the memory cells (e.g., programming of the memory cells is accidentally interrupted) and perform the second operation.

In another exemplary embodiment of FIG. 12, the memory management circuit 702 further determines whether a position of the distribution 1202 is located in an error range. The position of the distribution 1202 may be defined as a peak value of voltage of the distribution 1202 (i.e., a voltage position that the most memory cells located in the distribution 1202), an upper/lower limit of voltage of the distribution 1202, or any position of voltage in the distribution 1202. The error range includes a possible moving range of voltage of the threshold voltage distribution before the memory cells are programmed to the correct storage state. For example, the possible moving range includes any position between the distributions 1010 to 1050 shown in FIG. 10 (excluding the position of the distribution 1050). If the distribution range $\Delta V$ is greater than the distribution range $\Delta V_{ISPP}$ and/or the position of the threshold voltage distribution 1202 is not in the error range, the memory management circuit 702 may determine that the data in the memory cells is effectively programmed to the memory cells (i.e., conforming with the first condition) and perform the first operation. On the contrary, if the distribution range $\Delta V$ is smaller than the distribution range $\Delta V_{ISPP}$ and the position of the threshold voltage distribution 1202 is in the error range, the memory management circuit 702 may determine that the data in the memory cells is not effectively programmed to the memory cells (i.e., conforming with the second condition) and perform the second operation.

However, since the operation described in the exemplary embodiment shown in FIG. 12 needs to scan a plurality of memory cells in order to obtain the threshold voltage distribution of the memory cells, the operation may take a longer time. The disclosure thus provide another operation to more quickly obtain the result of the above determination.

Figure 13:
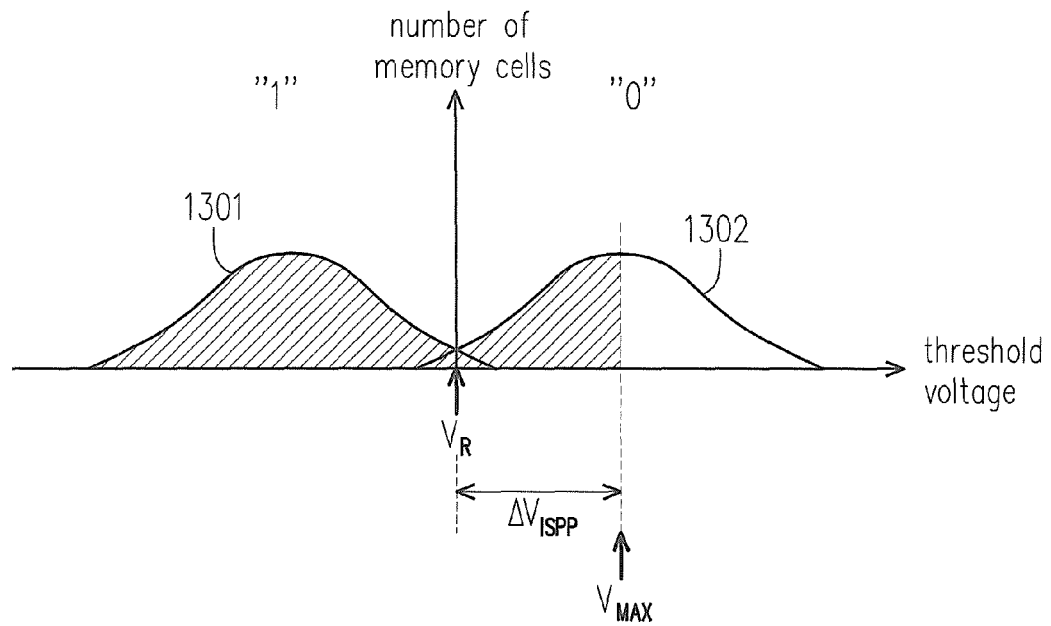
FIG. 13 is a schematic view illustrating determining whether data is effectively programmed to the memory cells according to another exemplary embodiment of the disclosure.

FIG. 13 is a schematic view illustrating determining whether data is effectively programmed to the memory cells according to another exemplary embodiment of the disclosure.

Referring to FIG. 13, distributions 1301 and 1302 are respectively the same as or similar to the distributions 1201 and 1202, so the repeated contents are not reiterated below. In this exemplary embodiment, the memory management circuit 702 does not need to completely scan the memory cells to obtain the distribution 1301 or 1302. In this exemplary embodiment, the memory management circuit 702 calculates the number (also called "first number") of a portion (also called "first memory cells") of the memory cells. The threshold voltage of each first memory cell is lower than an upper limit of the default bias range. For example, assuming that the default bias range is the distribution range $\Delta V_{ISPP}$, the upper limit of the default bias range is an upper limit voltage $V_{MAX}$ (as shown in FIG. 13). For example, the memory management circuit 702 may add a default bias range adjustment value to the default read voltage $V_R$ so as to obtain the upper limit of the default bias range. For example, the default bias range adjustment value is the value of the distribution range $\Delta V_{ISPP}$, and the default read voltage $V_R$ is an optimal read voltage or a currently used read voltage. In other words, the memory management circuit 702 calculates the number of all the memory cells in an area indicated with oblique lines in FIG. 13 as the first number.

In the exemplary embodiments shown in FIG. 11 and FIG. 13, if the number of memory cells having the threshold voltage lower than the upper limit voltage $V_{MAX}$ is regarded as the first number, the first number in the exemplary embodiment shown in FIG. 11 is significantly greater than the first number in the exemplary embodiment shown in FIG. 13. Thus, a threshold may be set. If the first number is greater than the threshold, it is indicated that the memory cells currently being checked are not programmed to the correct storage state (e.g., the threshold voltage distribution of the memory cells is similar to the distribution 1102), and it is likely that such circumstance occurs when the memory storage device 10 is suddenly powered off or turned off. On the contrary, if the first number is less than or equal to the threshold, it is indicated that the memory cells currently being detected are already programmed to the correct storage state (e.g., the threshold voltage distribution of the memory cells is similar to the distribution 1302). Thus, in this exemplary embodiment, the memory management circuit 702 determines whether the first number is greater than the threshold. If the first number is greater than the threshold, the memory management circuit 702 may determine that the storage state of the data conforms with the second condition. On the contrary, if the first number is less than or equal to the threshold, the memory management circuit 702 determines that the storage state of the data conforms with the first condition. In other words, the threshold serves for identifying whether the threshold voltage distribution of the memory cells currently being detected is similar to the distribution 1102 or the distribution 1302, or serves for identifying whether the data stored in the memory cells currently being checked is data stored before the memory storage device 10 is suddenly powered off or turned off and thereby contains many errors. For example, in the exemplary embodiment shown in FIG. 11, the first number is greater than the threshold, and thereby the memory cells are identified as storing invalid data. On the contrary, in the exemplary embodiment shown in FIG. 13, the first number is greater than the threshold value, and thereby the memory cells are identified as storing valid data. In this exemplary embodiment, the threshold may be set to be equal or close to the total number of memory cells currently being checked. For example, the threshold may be set at 90% to 100% of the total number of the memory cells currently being checked or lower. However, in another exemplary embodiment, the threshold may be adjusted based on the practical needs. In the above exemplary embodiment, the above operation for calculating the first number is used to replace the operation for obtaining the threshold voltage distribution of memory cells. However, in another exemplary embodiment, the above operation for calculating the first number may also be performed after the threshold voltage distribution of memory cells is obtained. Furthermore, in still another exemplary embodiment, the above operation for calculating the first number may also be regarded as a part of obtaining the threshold voltage distribution of memory cells, i.e., obtaining the threshold voltage distribution of memory cells with threshold voltages lower than the threshold.

In an exemplary embodiment, the above operations for determining whether the storage state of the data conforms with the first condition or the second condition may be used in part or used all together. For example, the memory cells being checked may be identified as programming not completed and storing invalid data (i.e., the storage state of the data conforms with the second condition) when the distribution range of the threshold voltage distribution is consistent with the default bias range, the position of the threshold voltage distribution is located in the error range, and the first number is greater than the threshold value.

In an exemplary embodiment, the above operations of determining whether the storage state of data conforms with the first condition or the second condition may be performed at any time point. Alternatively, in another exemplary embodiment, the above operations of determining whether the storage state of the data conforms with the first condition or the second condition may be performed at a specific time point. For example, the specific time point may include at least one of the time point when the memory storage device 10 is powered off and then supplied with power again (or turned off and then turned on again), the time point when the memory storage device 10 has been idling for a default time period, the memory storage device 10 is continuously in use over another default time period, the time point when the number of times of accessing some memory cells (e.g., the write counts, the read counts, and/or the erase counts) of the rewritable non-volatile memory module 406 exceeds a default number of times and the time point when the error bit number of the data read from the non-volatile memory module 406 exceeds a default value. Alternatively, it is possible for the user to choose to perform the above operations. For example, in an exemplary embodiment, after the memory storage device 10 is powered off and supplied with power again (or turned off and turned on again) or at any time point, if the memory management circuit 702 receives a plurality of bits from the rewritable non-volatile memory module 406 in response to a reading command sequence or by performing a start-up scanning (e.g., power on scanning), the error detecting and correcting circuit 708 may decode the bits by performing low density parity code (LDPC) decoding, for example, so as to find out the error bits in the bits. The memory management circuit 702 may determine the number of the error bits (i.e., the error bit number) is greater than a default value. If the error bit number is greater than the default value, the memory management circuit 702 may perform the operation of determining whether the storage state of the data conforms with the first condition or the second condition. On the contrary, if the error bit number is not greater than the default value, the memory management circuit 702 may perform a default operation. The default operation includes correcting the error bits in the data and sending the corrected data to the host system 11, for example.

Besides, in an exemplary embodiment, an operation for improving the accuracy of data storage may be included. For example, the first operation may further include erasing the memory cells identified as storing invalid data, and the second operation may further include updating the data of the memory cells identified as storing valid data and/or moving the data.

Figure 14:
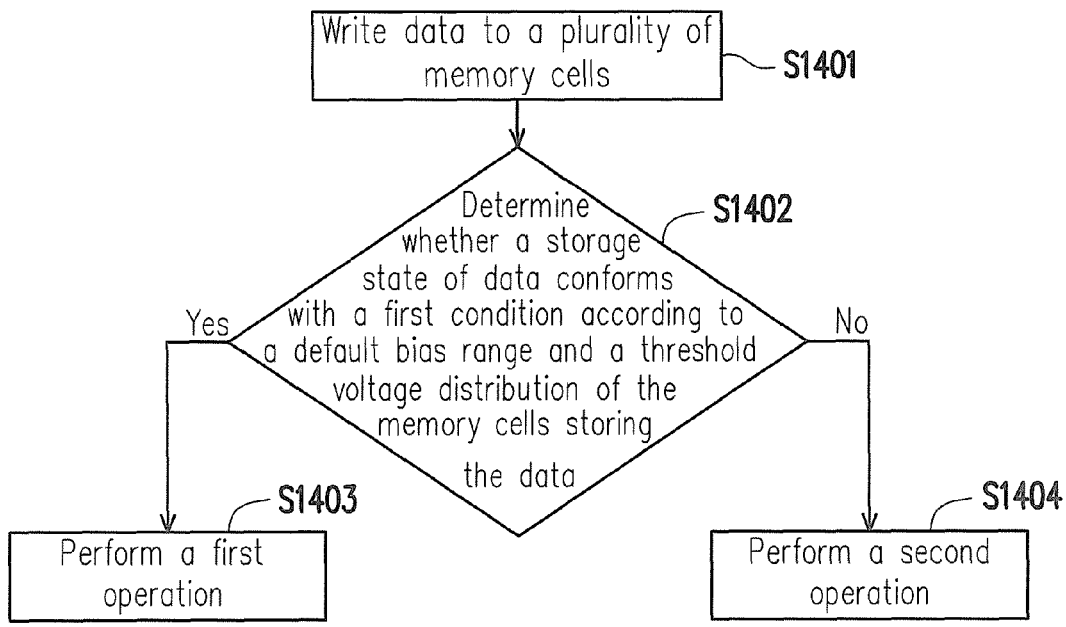
FIG. 14 is an exemplary schematic view illustrating a memory management method according to an exemplary embodiment of the disclosure.

FIG. 14 is an exemplary schematic view illustrating a memory management method according to an exemplary embodiment of the disclosure.

Referring to FIG. 14, at Step S1401, the data is written to the memory cells. At Step S1402, whether the storage state of the data conforms with the first condition is determined based on the default bias range and the threshold voltage distribution of the memory cells storing the data. If the storage state of the data conforms with the first condition, the first operation is performed at Step S1403. If the storage state of the data does not conform with the first condition (i.e., conforms with the second condition), the second operation is performed at Step S1404

Figure 15:
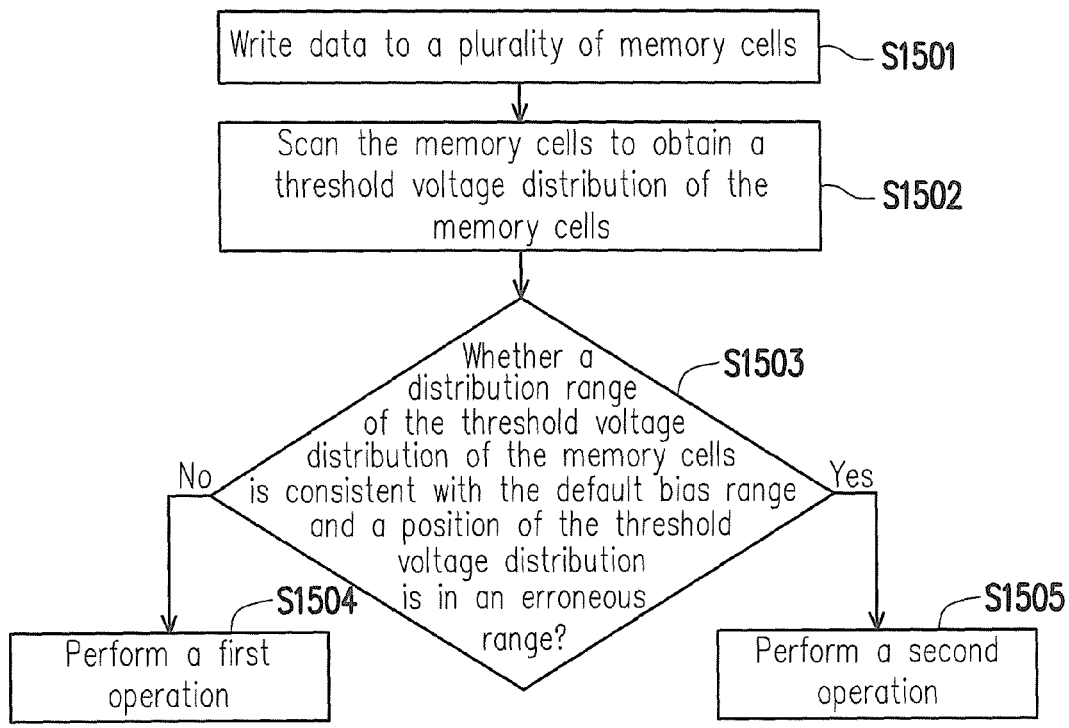
FIG. 15 is an exemplary schematic view illustrating a memory management method according to another exemplary embodiment of the disclosure.

FIG. 15 is an exemplary schematic view illustrating a memory management method according to another exemplary embodiment of the disclosure.

Referring to FIG. 15, at Step S1501, the data is written to the memory cells. At Step S1502, the memory cells are scanned to obtain the threshold voltage distribution of the memory cells. At Step S1503, whether the distribution range of the threshold voltage distribution of the memory cells is consistent with the default bias range and the position of the threshold voltage distribution is in the error range are determined. If the distribution range of the threshold voltage distribution of the memory cells is inconsistent with the default bias range and/or the position of the threshold voltage distribution is not in the error range, the first operation is performed at Step S1504. If the distribution range of the threshold voltage distribution of the memory cells is consistent with the default bias range and the position of the threshold voltage distribution is in the error range, the second operation is performed at Step S1505.

Figure 16:
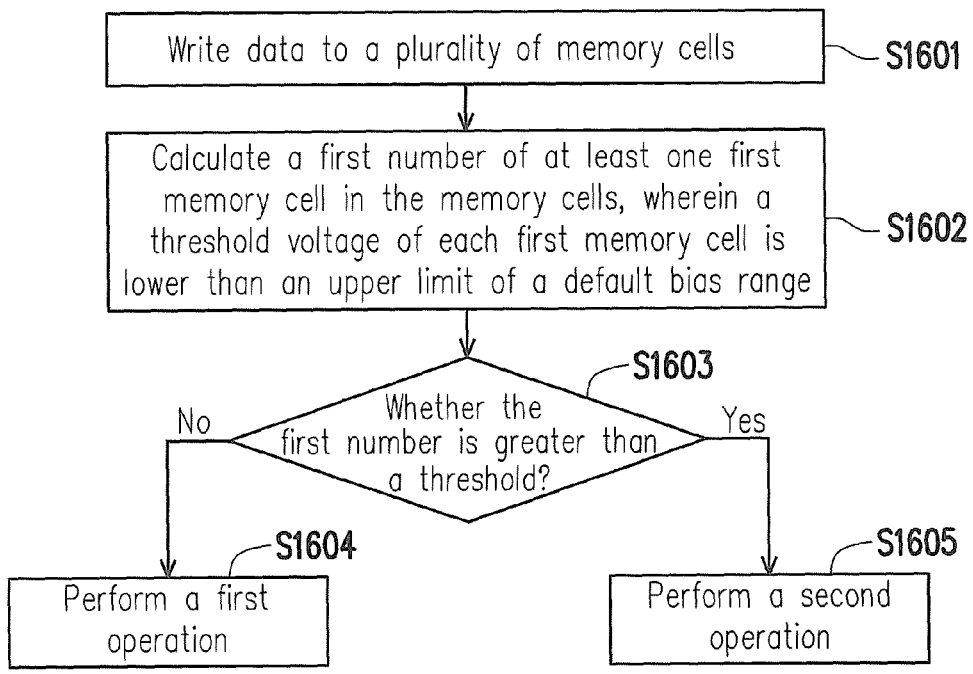
FIG. 16 is an exemplary schematic view illustrating a memory management method according to another exemplary embodiment of the disclosure.

FIG. 16 is an exemplary schematic view illustrating a memory management method according to another exemplary embodiment of the disclosure.

Referring to FIG. 16, at Step S1601, the data is written to the memory cells. At Step S1602, the first number of the first memory cells in the memory cells are calculated. Here, the threshold voltage of each of the first memory cells is lower than the upper limit of the default bias range. At Step S1603, whether the first number is greater than the threshold is determined. If the first number is not greater than the threshold, the first operation is performed at Step S1604. If the first number is greater than the threshold, the second operation is performed at Step S1605.

Figure 17:
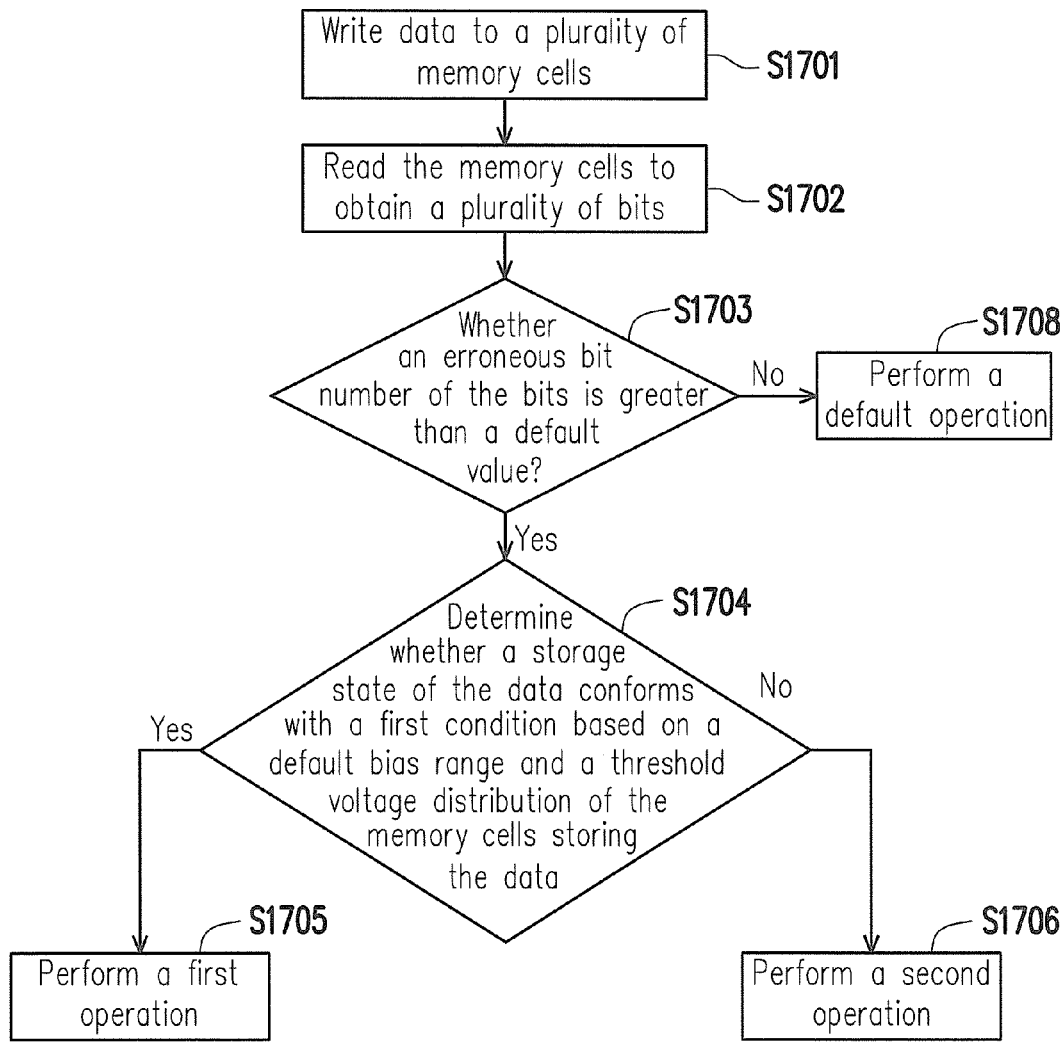
FIG. 17 is an exemplary schematic view illustrating a memory management method according to another exemplary embodiment of the disclosure.

FIG. 17 is an exemplary schematic view illustrating a memory management method according to another exemplary embodiment of the disclosure.

Referring to FIG. 17, at Step S1701, the data is written to the memory cells. At Step S1702, the memory cells are read to obtain the bits. At Step S1703, whether the error bit number of the bits is greater than the default value is determined. If the error bit number of the bits is greater than the default value, at Step S1704, whether the storage state of the data conforms with the first condition is determined based on the default bias range and the threshold voltage distribution of the memory cells storing the data. If the storage state of the data conforms with the first condition, the first operation is performed at Step S1705. If the storage state of the data does not conform with the first condition (i.e., conforms with the second condition), the second operation is performed at Step S1706. In addition, if the error bit number is not greater than the default value, the default operation is performed at Step S1707.

Since details of the steps shown in FIGS. 14 to 17 are described above, the repeated contents will not be reiterated. It should be noted that the steps shown in FIGS. 14 to 17 may be implemented as a plurality of program codes or circuits, and the disclosure does not intend to impose a limitation in this respect. Also, the methods shown in FIGS.

14 to 17 may be used with the above exemplary embodiments or used alone. The disclosure is not limited thereto.

In view of the foregoing, differing from the conventional way that whether data in the memory cells is valid and/or whether the programming of the memory cells is accidentally interrupted is determined simply based on the number of error bits in the read data, the disclosure is capable of using the bias region to find out the invalid data written before the system is powered off, and thereby effectively reducing the probability of misjudging valid data as invalid data.

The previously described exemplary embodiments of the disclosure have the advantages aforementioned, wherein the advantages aforementioned not required in all versions of the disclosure.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A memory management method for a rewritable non-volatile memory module comprising a plurality of memory cells, the method comprising:
   programming data to the memory cells;
   determining whether a storage state of the data conforms with a first condition or a second condition based on a default bias range and a threshold voltage distribution of the memory cells storing the data, wherein the first condition corresponds to that a programming operation for the memory cells is finished, and the second condition corresponds to that the programming operation for the memory cells is terminated before the programming operation is finished;
   performing a first operation if the storage state of the data conforms with the first condition; and
   performing a second operation if the storage state of the data conforms with the second condition,
   wherein the first operation is different from the second operation.

2. The memory management method as claimed in claim 1, wherein the step of determining whether the storage state of the data conforms with the first condition or the second condition comprises:
   scanning the memory cells to obtain the threshold voltage distribution of the memory cells;
   determining whether a distribution range of the threshold voltage distribution is consistent with the default bias range; and
   determining that the storage state of the data conforms with the second condition if the distribution range of the threshold voltage distribution is consistent with the default bias range.

3. The memory management method as claimed in claim 2, wherein the step of determining whether the storage state of the data conforms with the first condition or the second condition further comprises:
   determining whether a position of the threshold voltage distribution is in an error range.

4. The memory management method as claimed in claim 1, wherein the step of determining whether the storage state of the data conforms with the first condition or the second condition comprises:
   calculating a first number of at least one first memory cell in the memory cells, wherein a threshold voltage of each of the at least one first memory cell is lower than an upper limit of the default bias range;
   determining whether the first number is greater than a threshold; and
   determining that the storage state of the data conforms with the second condition if the first number is greater than the threshold.

5. The memory management method as claimed in claim 4, further comprising:
   adding a default bias range adjustment value to a default read voltage to obtain the upper limit of the default bias range.

6. The memory management method as claimed in claim 1, wherein the default bias range conforms with a programming model of incremental-step-pulse programming (ISPP).

7. The memory management method as claimed in claim 1, wherein the first operation comprises identifying the data stored in the memory cells as valid data and decoding the data,
   wherein the second operation comprises identifying the data stored in the memory cells as invalid data and not decoding the data.

8. The memory management method as claimed in claim 1, further comprising:
   reading the memory cells to obtain a plurality of bits; and
   determining whether an error bit number of the bits is greater than a default value,
   wherein the step of determining whether the storage state of the data conforms with the first condition or the second condition is performed when the error bit number is greater than the default value.

9. A memory storage device, comprising:
   a connecting interface unit, coupled to a host system;
   a rewritable non-volatile memory module, comprising a plurality of memory cells; and
   a memory controlling circuit unit, coupled to the connecting interface unit and the rewritable non-volatile memory module,
   wherein the memory controlling circuit unit is configured to write data to the memory cells,
   wherein the memory controlling circuit unit is further configured to determine whether a storage state of the data conforms with a first condition or a second condition based on a default bias range and a threshold voltage distribution of the memory cells storing the data,
   wherein the memory controlling circuit unit is further configured to perform a first operation if the storage state of the data conforms with the first condition,
   wherein the memory controlling circuit unit is further configured to perform a second operation if the storage state of the data conforms with the second condition,
   wherein the first operation is different from the second operation,
   wherein the first operation comprises identifying the data stored in the memory cells as valid data and decoding the data, and the second operation comprises identifying the data stored in the memory cells as invalid data and not decoding the data.

10. The memory storage device as claimed in claim 9, wherein the operation that the memory controlling circuit unit determines whether the storage state of the data conforms with the first condition or the second condition comprises:
   scanning the memory cells to obtain the threshold voltage distribution of the memory cells;

determining whether a distribution range of the threshold voltage distribution is consistent with the default bias range; and determining that the storage state of the data conforms with the second condition if the distribution range of the threshold voltage distribution is consistent with the default bias range.

11. The memory storage device as claimed in claim 10, wherein the operation that the memory controlling circuit unit determines whether the storage state of the data conforms with the first condition or the second condition further comprises:

determining whether a position of the threshold voltage distribution is in an error range.

12. The memory storage device as claimed in claim 9, wherein the operation that the memory controlling circuit unit determines whether the storage state of the data conforms with the first condition or the second condition comprises:

calculating a first number of at least one first memory cell in the memory cells, wherein a threshold voltage of each of the at least one first memory cell is lower than an upper limit of the default bias range;

determining whether the first number is greater than a threshold; and determining that the storage state of the data conforms with the second condition if the first number is greater than the threshold.

13. The memory storage device as claimed in claim 12, wherein the memory controlling circuit unit is further configured to add a default bias range adjustment value to a default read voltage to obtain the upper limit of the default bias range.

14. The memory storage device as claimed in claim 9, wherein the default bias range conforms with a programming model of incremental-step-pulse programming.

15. The memory storage device as claimed in claim 9, wherein the memory controlling circuit unit is further configured to obtain a plurality of bits by reading the memory cells, wherein the memory controlling circuit unit is further configured to determine whether an error bit number of the bits is greater than a default value, wherein the operation of determining whether the storage state of the data conforms with the first condition or the second condition is performed when the error bit number is greater than the default value.

16. A memory controlling circuit unit for controlling a rewritable non-volatile memory module comprising a plurality of memory cells, the memory controlling circuit unit comprising:

a host interface, coupled to a host system;

a memory interface, coupled to the rewritable non-volatile memory module; and a memory management circuit, coupled to the host interface and the memory interface, wherein the memory management circuit is configured to send a writing command sequence and the writing command sequence instruct to write data to the memory cells, wherein the memory management circuit is further configured to determine whether a storage state of the data conforms with a first condition or a second condition based on a default bias range and a threshold voltage distribution of the memory cells storing the data, wherein the first condition corresponds to that a programming operation for the memory cells is finished, and the second condition corresponds to that the programming operation for the memory cells is terminated before the programming operation is finished, wherein the memory management circuit is further configured to perform a first operation if the storage state of the data conforms with the first condition, wherein the memory management circuit is further configured to perform a second operation if the storage state of the data conforms with the second condition, wherein the first operation is different from the second operation.

17. The memory controlling circuit unit as claimed in claim 16, wherein the operation that the memory management circuit determines whether the storage state of the data conforms with the first condition or the second condition comprises:

scanning the memory cells to obtain the threshold voltage distribution of the memory cells;

determining whether a distribution range of the threshold voltage distribution is consistent with the default bias range; and determining that the storage state of the data conforms with the second condition if the distribution range of the threshold voltage distribution is consistent with the default bias range.

18. The memory controlling circuit unit as claimed in claim 17, wherein the operation that the memory management circuit determines whether the storage state of the data conforms with the first condition or the second condition further comprises:

determining whether a position of the threshold voltage distribution is in an error range.

19. The memory controlling circuit unit as claimed in claim 16, wherein the operation that the memory management circuit determines whether the storage state of the data conforms with the first condition or the second condition comprises:

calculating a first number of at least one first memory cell in the memory cells, wherein a threshold voltage of each of the at least one first memory cell is lower than an upper limit of the default bias range;

determining whether the first number is greater than a threshold; and determining that the storage state of the data conforms with the second condition if the first number is greater than the threshold.

20. The memory controlling circuit unit as claimed in claim 19, wherein the memory management circuit is further configured to add a default bias range adjustment value to a default read voltage to obtain the upper limit of the default bias range.

21. The memory controlling circuit unit as claimed in claim 16, wherein the default bias range conforms with a programming model of incremental-step-pulse programming.

22. The memory controlling circuit unit as claimed in claim 16, wherein the memory controlling circuit unit further comprises an error detecting and correcting circuit, wherein the first operation comprises identifying the data stored in the memory cells as valid data and instructing the error detecting and correcting circuit to decode the data, wherein the second operation comprises identifying the data stored in the memory cells as invalid data and not instructing the error detecting and correcting circuit to decode the data.

23. The memory controlling circuit unit as claimed in claim 16, wherein the memory management circuit further sends a reading command sequence, wherein the reading command sequence instruct to read the memory cells to obtain a plurality of bits, wherein the memory management circuit is further configured to determine whether an error bit number of the bits is greater than a default value, wherein the operation of determining whether the storage state of the data conforms with the first condition or the second condition is performed when the error bit number is greater than the default value.

\* \* \* \* \*